United States Patent [19]
Charbonneau et al.

[11] Patent Number: 5,395,793
[45] Date of Patent: Mar. 7, 1995

[54] METHOD OF BANDGAP TUNING OF SEMICONDUCTOR QUANTUM WELL STRUCTURES

[75] Inventors: Sylvain Charbonneau, Cumberland; Emil S. Koteles, Ottawa, both of Canada

[73] Assignee: National Research Council of Canada, Ottawa, Canada

[21] Appl. No.: 172,094

[22] Filed: Dec. 23, 1993

[51] Int. Cl.[6] .......................................... H01L 21/20
[52] U.S. Cl. ...................... 437/133; 437/105; 437/107; 437/126; 437/129
[58] Field of Search ............... 437/129, 133, 105, 107, 437/126

[56] References Cited

U.S. PATENT DOCUMENTS

| | | | |
|---|---|---|---|
| 4,511,408 | 4/1985 | Holonyak et al. | 437/133 |
| 4,771,010 | 9/1988 | Epler et al. | 437/129 |
| 4,871,690 | 10/1989 | Holonyak et al. | 437/129 |
| 5,238,868 | 8/1993 | Elman et al. | 437/133 |

OTHER PUBLICATIONS

Elman et al. in "GaAs/AlGaAs quantum-well intermixing using shallow ion-implantation and rapid thermal annealing" in J. Appl. Phys. vol. 66, Sep. 1989, pp. 2104–2107.

*Primary Examiner*—R. Bruce Breneman
*Assistant Examiner*—Ramamohan Rao Paladugu

[57] ABSTRACT

A method of selectively tuning the bandedge of a semiconductor heterostructure includes repeatedly forming a disordered region that is spatially separated from a quantum well active region and subsequently annealing the heterostructure each time after the disordered region is formed, so that vacancies/defects in the disordered region diffuse into the quantum well region and enhance interdiffusion at the well-barrier heterojunctions. Repeating, the disordering followed by annealing allows for a greater range in bandgap tuning. The heterostuctures of interest are III-V material systems, such as AlGaAs/GaAs, where the active region includes structures such as a single quantum well, a multiple quantum well, or a superlattice.

16 Claims, 3 Drawing Sheets

METHOD OF BANDGAP TUNING OF SEMICONDUCTOR QUANTUM WELL STRUCTURES

FIELD OF THE INVENTION

This, invention relates to semiconductor heterostructures and, more specifically, to a method of bandgap tuning of a quantum well structure.

BACKGROUND OF THE INVENTION

Optical and electrical properties of quantum well structures are of great importance for novel semiconductor device applications. An ultimate goal of monolithic integration of optical, optoelectronic and electronic components requires the capability for controllable lateral and vertical modifications of optical constants and electrical characteristics in such components.

The selective intermixing of group III atoms across heterostructure interfaces, especially in GaAs/AlGaAs quantum well structures, has been extensively studied due to the controllable changes in optical bandgap which accompany well-barrier interdiffusion.

Impurity induced compositional disordering (IICD) is a well known technique for enhancing interdiffusion. It has been successfully applied to the fabrication of superlattice and quantum well heterostructure devices. In particular, IICD has been demonstrated in a variety of structures by using a diffusion process, and also by using ion implantation followed by thermal annealing. Experimental results have shown that ion implantation is a suitable technique for introducing many kinds of impurities into quantum well structures to enhance interdiffusion.

In conventional ion implantation intermixing techniques, the range profile of relevance to intermixing is always considered to be the range for energy losses to nuclear damage processes, and the enhancement of interdiffusion is always associated with the presence of implantation induced defects and/or impurities. The mass and energy of the implanted ions are always chosen such that the impurities/damage distribution are spatially peaked in the region of interest for intermixing., such as the middle of a multiple quantum well or a superlattice structure.

Holonyak in U.S. Pat. No. 4,511,408 discloses a method for disordering the layers in a III-V heterostructure by implanting ions directly into the sample (region of intermixing) and then subjecting the sample to the thermal annealing. As noted in column 4, lines 30-34 the implantation causes considerable crystal damage in the structure, that in this case was a superlattice. The above method for enhancing interdiffusion at heterointerfaces is also disclosed by Hirayama et at. in "Ion-Species Dependence of Interdiffusion in Ion-Implanted GaAs-AlAs Superlattices", Japanese Journal of Applied Physics, 24, pp. 1498–15023 (1985), and by Cibert et at. in "Kinetics of Implantation Enhanced Interdiffusion of Ga and Al at GaAs-$Ga_xAl_{1-x}As$ Interfaces", Applied Physics Letters, 49(4), pp. 223–225(1986).

Hirayama et at. implanted a group of samples containing superlattices with a variety of ion species and then measured the photoluminescence peak shifts while the samples were being annealed. As in Holonyak, the ions were implanted directly into the superlattice structure, causing crystal damage in the region of intermixing that required thermal treatment to effect recovery. Hirayama et at. observed that the spectral width of the superlattice structure increased after annealing, and explained that the increase is partly due to the inhomogeneity of the interdiffusion resulting from the inhomogenous depth profile of implanted impurity density. Cibert et at. presented spectral measurements of GaAs quantum well structure implanted with Gallium ions and subsequently annealed. Disadvantageously, the implantation caused damage centered on the quantum well and extending deep into the barriers. In fact, the maximum damage from one of the higher ion doses was almost enough to produce amorphization.

In an attempt to obviate the disadvantageous of the above mentioned prior art, Elman et at. in U.S. Pat. No. 5,238,868 describe a method of selectively tuning the bandedge in a quantum well heterostructure. The method steps include implanting ions into the heterostructure to form a disordered region near the upper surface of the sample. Vacancies and defects created by the implantation step are spatially separated from the quantum well active region. The heterostructure is then thermally annealed so that the vacancies diffuse through the active region (quantum wells) and enhance interdiffusion at the heterojunctions thereby modifying the optical bandgap of the quantum well layers. This bandgap tuning is somewhat selective because the implantation step can be to an extent controlled. Although the method described by Elman et at. provides fair results, large energy shifts necessary for many envisaged applications cannot be attained using this method. For example, experiments have shown that by using a method (focused ion beam), similar to Elman's, as the ion implant dose increases, the bandgap change of a quantum well increases monotonically until it saturates, after which, a decrease in the bandgap energy occurs. This saturation takes place because above this dose, there is excessive damage at the surface of the structure that ion channeling becomes difficult and it is no longer possible to deposit ions directly into the quantum wells. A similar effect occurs when shallow ion implantation is used to generate single vacancies.

It is therefore an object of this invention to provide a method of controllably tuning the optical bandgap of a semiconductor heterostructure that overcomes these disadvantages and limitations.

SUMMARY OF THE INVENTION

In accordance with the invention, a method is provided of processing a semiconductor heterostructure having a single quantum well structure as an active region, wherein a cladding layer is deposited on said single quantum well structure, comprising the steps of:
a) forming a disordered region in said cladding layer wherein said disordered region is spatially separated from said quantum well structure;
b) thermally annealing said semiconductor heterostructure so that the vacancies/defects in said disordered region are caused to diffuse through said quantum well structure and enhance intermixing of atoms at heterojunctions of said quantum well structure, thereby at least partially reordering the disordered region, wherein the single quantum well structure still exists after said annealing step and exhibits a changed bandgap characteristic;
c) reforming a disordered region by repeating step (a); and,
d) repeating step (b).

In accordance with yet another aspect of the invention, a method is provided for processing a semiconductor heterostructure having a multiple quantum well structure as an active region, wherein a cladding layer is deposited on said multiple quantum well structure, comprising the steps of:
  a) forming a disordered region in said cladding layer wherein said disordered region is spatially separated from said multiple quantum well structure;
  b) thermally annealing said semiconductor heterostructure so that vacancies/defects in said disordered region are caused to diffuse through said quantum well structure and enhance intermixing of atoms at heterojunctions of said multiple quantum well structure, thereby at least partially reordering the disordered region, wherein the multiple quantum well structure still exists after said annealing step and exhibits a changed bandgap characteristic;
  c) reforming a disordered region in said cladding layer wherein said disordered region is spatially separated from said multiple quantum well structure, thereby at least partially reordering the disordered region; and
  d) thermally annealing said semiconductor heterostructure so that vacancies/defects in said disordered region are caused to diffuse through said quantum well structure and enhance intermixing of atoms at heterojunctions of said multiple quantum well structure, thereby at least partially reordering the disordered region, wherein the multiple quantum well structure still exists after said annealing step and exhibits a changed bandgap characteristic.

Advantageously and quite unexpectedly, performing step (a) and (b) sequentially and repeatedly allows the bandgap to be further and further increased. This is somewhat surprising, as tests have shown that increasing the amount of implantation and increasing the anneal time without repeating steps (a) and (b) in the manner described by Elman et al. provides only a limited increase in the bandgap. In fact, after steadily increasing the amount of implantation or the duration of annealing, there is a peak point after which the bandgap actually begins to decrease. The method of this invention therefore, provides a process that is viable for the manufacture of semiconductor devices.

DETAILED DESCRIPTION

Figure 1A:
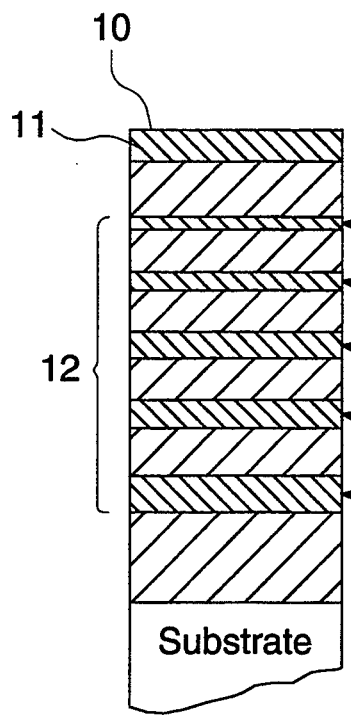
FIG. 1A and 1B are lateral views of prior art heterostructure devices that were tuned in accordance with the present invention and which include plurality of quantum well layers grown in standard and reverse order, respectively.

The present application discloses a novel method for bandedge tuning in III-V semiconductor material systems by controlling the level of atomic interdiffusion at heterointerfaces of the system. The material systems of interest are semiconductor heterostructures having a quantum well structure as an active or part of an active region, and include such devices as a laser, detector, amplifier, modulator waveguide, etc.

By way of example, and in accordance with a tuning method of the present invention, a heterostructure to be tuned is first implanted with low energy ions and then subjected to thermal annealing. Of course, implantation need not be limited to low energy ions. This process of implanting and annealing is subsequently repeated at least once and perhaps a number of times depending on the level of tuning required. Each implantation creates a disordered region near the upper surface of the heterostructure wherein the vacancies and defects are spatially separated from the quantum well region, thus ensuring that no damage will occur to the active region. Following each implantation procedure, the heterostructure is thermally annealed so that the vacancies diffuse into the quantum well structure and enhance the intermixing between atoms at the heterointerfaces. After each anneal, the once disordered region becomes more ordered again. The result of this interdiffusion is modification of the shape of the quantum well layers with a corresponding change in their ground state energy levels. Controlling the parameters of the ion implantation and thermal annealing steps effectively permits one to partially tune the bandgap of the quantum well layers. However, in order to further increase this bandgap beyond its upper limit, it is necessary to repeat the ion implantation step and annealing step; subsequent repetitions providing further increase in the bandgap.

The samples in FIGS. 1A–1D were grown by molecular beam epitaxy in a RIBER 2300 system, and include a quantum well active region with alternating layers of a GaAs quantum well layer and an AlGaAs barrier layer. It should be well known to those skilled in the art that other quantum well structures having different compounds would be capable of being tuned in accordance with the present invention. Ion beam implantation was performed using 35 keV $^{75}$As$^+$ ions having a fluence range of between $5 \times 10^{13}$ cm$^{-2}$ and $5 \times 10^{13}$ cm$^{-2}$. The samples were masked prior to implantation so that only half of each piece was implanted, allowing a direct comparison between the respective bandgap changes in the implanted and unimplanted areas. Following implantation, rapid thermal annealing (RTA) was performed at 950 degrees C. using the enhanced overpressure proximity technique described by Armiento et at. in Appl. Phys. Lett., Vol. 48, p. 1623 (1986) The samples were then mounted strain-free in a cryostat and cooled to 5 K. Photoluminescence (PL) spectroscopes were used to monitor the excitonic energies. Room temperature transmission measurements were done on the MQW samples.

Figure 1B:
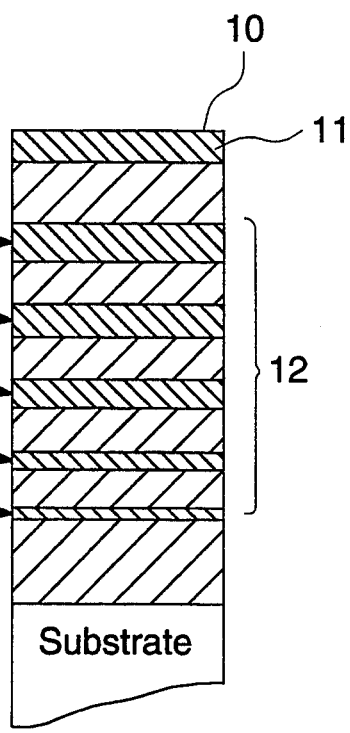

The heterostructures in FIGS. 1A and 1B consist of a quantum well active region 12 having a series of single quantum well layers labeled SQW1–SQW5 grown in standard and reverse order, respectively. The well layers are uncoupled and varying widths, with the layer SQW1 in each active region being located approximately 300 nm below the upper surface 10. A barrier layer separates adjacent quantum well layer SQW1, thereby preventing the defects created by ion implantation from damaging the active region 12. Consequently, the material quality of the well layers is preserved. After a first implantation, thermal annealing is performed to enhance the interdiffusion at the well-barrier heterojunctions.

Figure 1C:
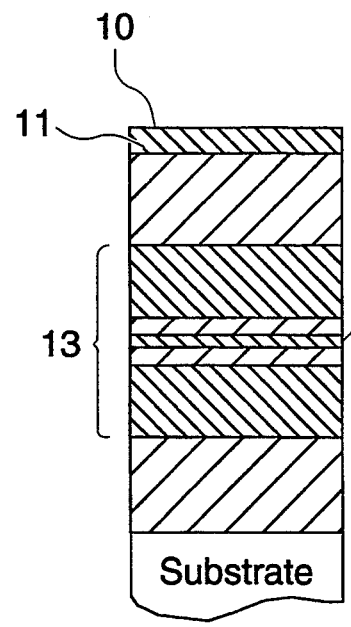
FIG. 1C is a lateral view of a prior art double heterostructure semiconductor waveguide where the bandgap of the single quantum well layer was tuned in accordance with the present invention.
Figure 1D:
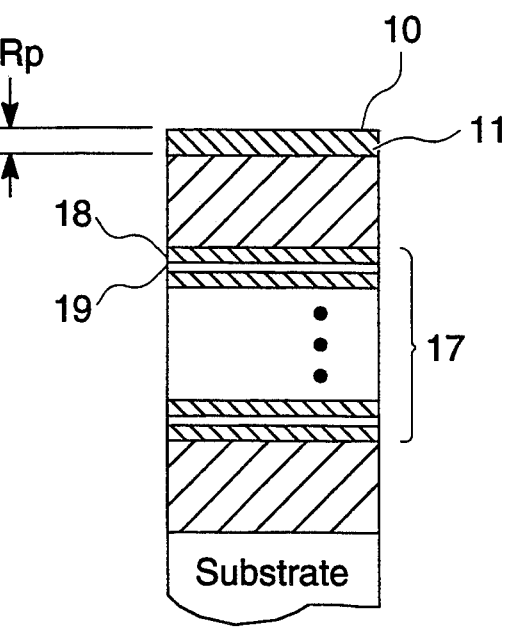
FIG. 1D is a lateral view of a prior art multiple quantum well (MQW) waveguide where the bandgap of each quantum well layer and subsequently the waveguide as a whole were tuned in accordance with the present invention.

The structure in FIG. 1C is a simple double heterostructure waveguide 13 with a 4 nm-wide control single quantum well layer 16 in the middle of 1.2 gm of GaAs. FIG. 1D shows a multiple quantum well waveguide 17 consisting of twenty-five periods of 8 nm GaAs single quantum well layers 18 separated by 8 nm of $Al_{0.3}Ga_{0.7}As$ barriers 19. In accordance with the tuning method, the upper surface 10 in each of FIGS. 1C and 1D was ion implanted to create a disordered region 11 of depth $R_p$. Significantly, as in FIGS. 1A and 1B, the disordered region 11 in both FIGS. 1C and 1D is spatially separated from its respective region.

The particular structures in the above discussion of FIGS. 1A-1D are for illustrative purposes only, and should not serve to limit the application of the novel tuning method to only these heterostructure devices. It should be apparent to those skilled in the art that other heterostructures containing quantum wells in the active region could be similarly tuned. An important aspect of the novel tuning method is that as the ion implantation and thermal annealing steps are sequentially repeated; a designer may therefore increase the bandedge of the device under investigation far beyond limits possible with a single implantation followed by rapid thermal annealing. This will be described particularly with reference to FIG. 3.

Figure 2:
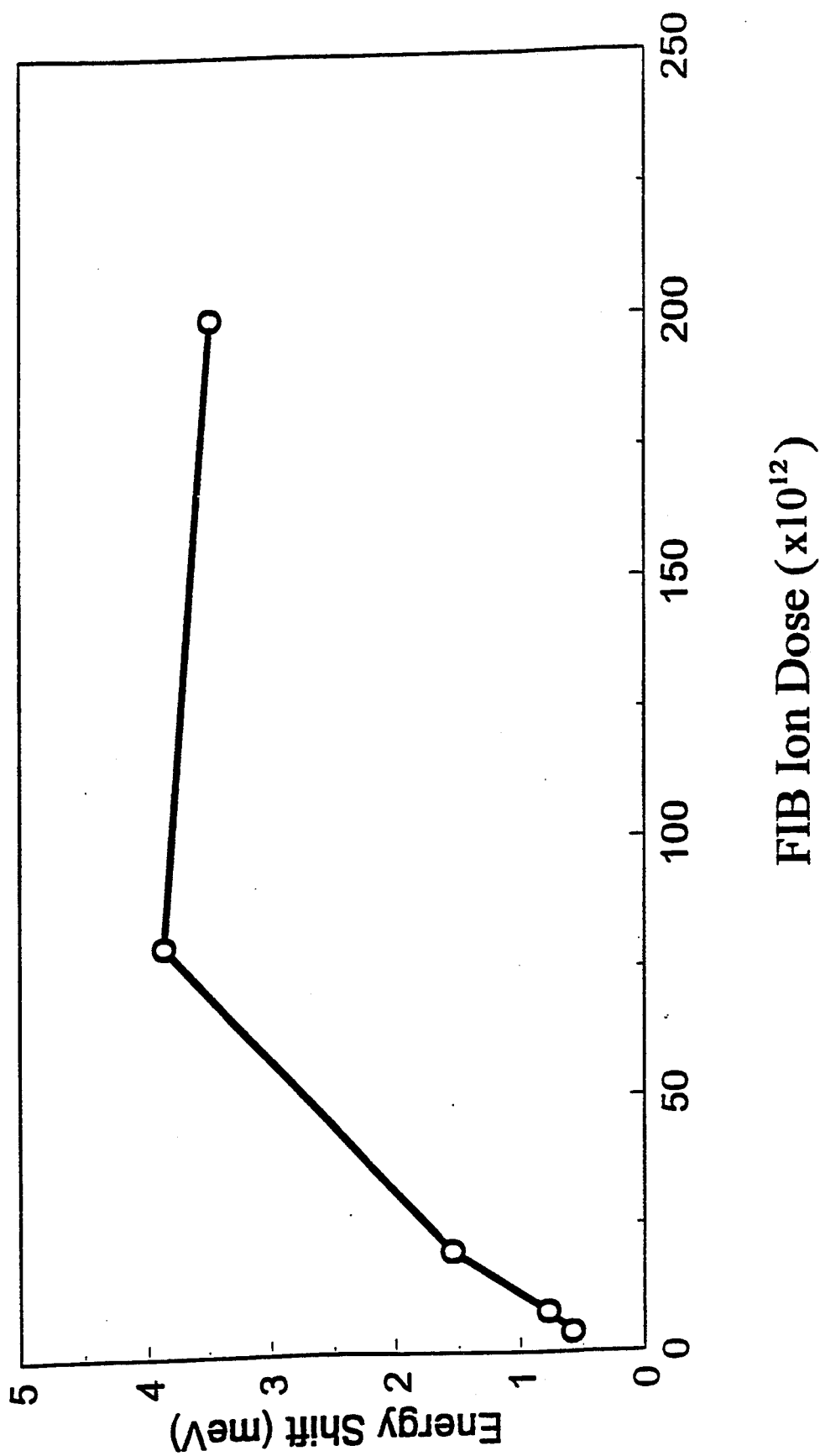
FIG. 2 graphically illustrates the relationship between the FIB ion dose implanted versus the emission energy shift (meV) for structure in FIG. 1A.

Now referring to FIG. 2, it can be seen that as the focused ion beam (FIB) ion dose is increased, the (emission) energy shift which is proportional to the bandgap energy, increases montonically from approximately 0.5 meV to approximately 4 meV until it saturates. Unfortunately, further increasing the ion implantation dose beyond a fluence of about $10^{13}$ cm$^{-2}$ degrades the process so that the energy shift begins to decrease. This behaviour is a consequence of the fact that single, isolated vacancies have higher mobilities than the vacancy complexes that occur with greater probability when high fluences are employed. These complexes that are created tend to not move as readily when heat is applied. Thus the magnitude of intermixing actually decreases when large numbers of ions are implanted in a single instance of implantation. This in effect creates an upper limit to the energy shift attainable with a single implantation followed by RTA. It has been found however, that this limitation can be overcome by repeating the process after the first rapid thermal annealing.

Figure 3:
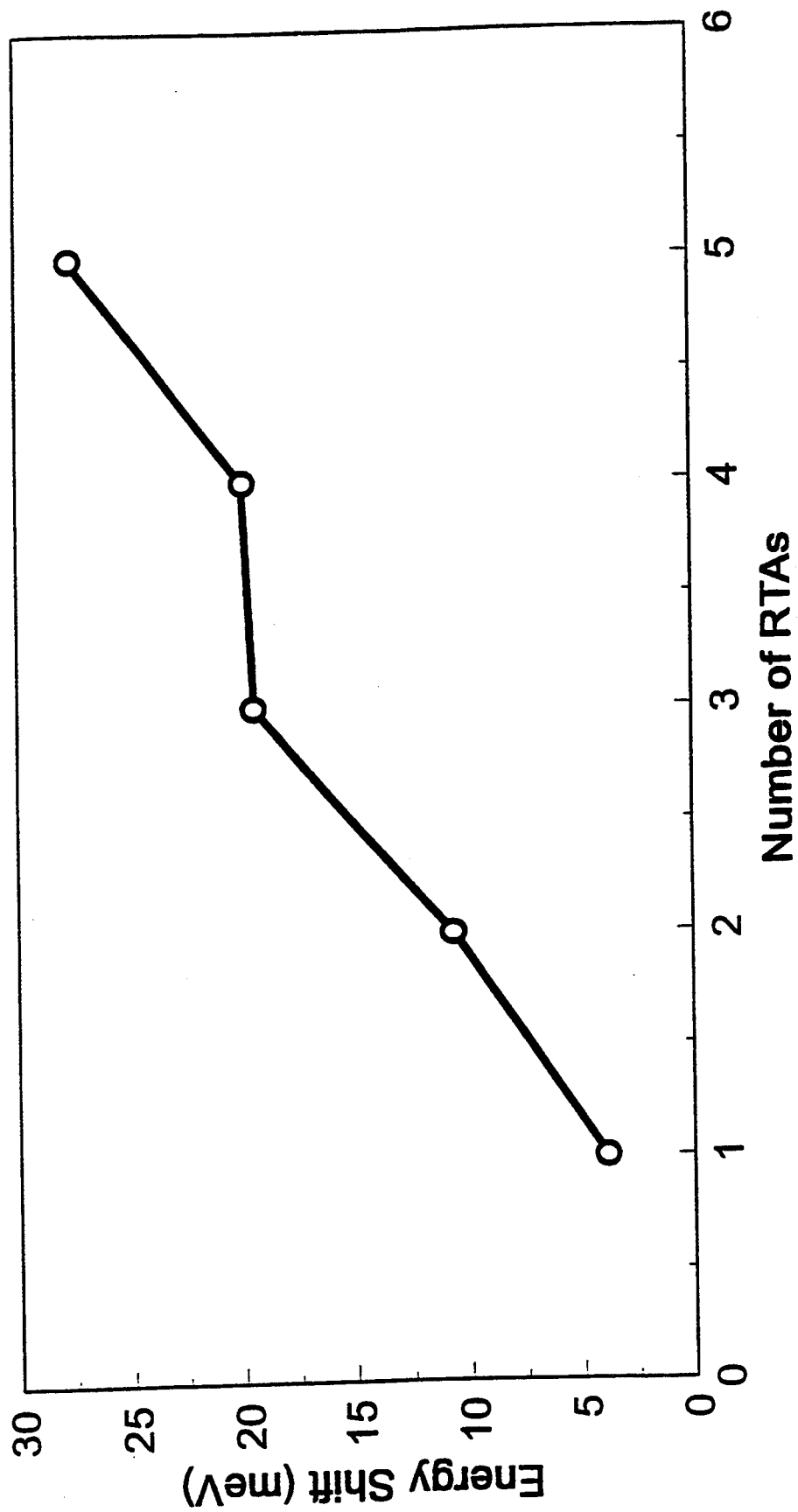
FIG. 3 graphically illustrates the relationship between the emission energy shift (meV) versus the number of rapid thermal anneals performed.

Now referring to FIG. 3, a large increase in bandgap shift is shown by using the method in accordance with this invention. The initial maximum 4 meV shift of FIG. 2 is increased to 11 meV after a second FIB implant and RTA. This is further increased to approximately 20 meV after a third implant and RTA. The fourth RTA, which produced no further increase in bandgap shift, was performed with no additional implant in order to verify that both implanting and RTA are necessary to effect additional bandgap shifts. Therefore the application of heat alone is not enough to create additional shift in the bandgap. The fifth RTA, which produced an additional 8 meV shift was performed after another implant.

It is believed that better results may be obtained by slightly increasing the period of time during which the RTA takes place. It should also be considered, that annealing for too long may damage the structure.

Although the above discussion of the novel tuning method has been concerned with tuning a single active region containing quantum wells, the present invention can also be used to tune a group of quantum well regions in a spatially selective manner. The spatial selection is effected by masking a heterostructure in accordance with a specified pattern so that the unmasked portions correspond to designated regions of the structure where tuning is desirable. During subsequent ion implantation, disordered regions are only formed in the unmasked areas. As was the case with the tuning of a single active region, the vacancies and defects in each disordered region are spatially separated from their respective quantum well regions. Thermal treatment of the heterostructure causes enhanced interdiffusion to occur in only the quantum well regions of the unmasked areas. In addition, masking can be performed in combination with subsequent implanting followed by RTA to one or more regions of the heterostructure, thereby allowing for tuning within a very large bandgap range. As well other masks can be applied after the first masking and annealing and the process can be repeated. Fine tuning can be obtained by varying the parameters at each ion implant stage, and a broad range of tuning can be obtained by repeatedly implanting and annealing any particular region.

What has been shown and described herein is a novel tuning method that permits accurate and precise modification of the structural parameters of semiconductor quantum well shapes (geometrical shapes and widths, barrier heights and composition in the well) in a spatially selective manner. These modifications result in controllable tuning within a wide range of the resonant absorption (optical bandgap) energies (wavelengths) of the semiconductor structure. Advantageously, the method will allow monolithic integration of optical, optoelectronic and electronic components on a single semiconductor wafer.

What we claim is:

1. A method is provided of processing a semiconductor heterostructure having a single quantum well structure as an active region, wherein a cladding layer is deposited on said single quantum well structure, comprising the steps of:
    a) forming a disordered region in said cladding layer wherein said disordered region is spatially separated from said quantum well structure;
    b) thermally annealing said semiconductor heterostructure so that the vacancies/defects in said disordered region are caused to diffuse through said quantum well structure and enhance intermixing of atoms at heterojunctions of said quantum well structure, thereby at least partially reordering the disordered region, wherein the single quantum well structure still exists after said annealing step and exhibits a changed bandgap characteristic;
    c) reforming a disordered region by repeating step (a); and,
    d) repeating step (b).

2. The method of selectively tuning the bandedge of a semiconductor heterostructure as defined in claim 1 wherein the step of forming a disordered region includes the step of:
    implanting ions into the cladding layer to create the disordered region.

3. The method of selectively tuning the bandedge of a semiconductor heterostructure as defined in claim 2, wherein the thermal annealing step is performed for at least 15 seconds.

4. A method of processing a semiconductor heterostructure having a multiple quantum well structure as an active region, wherein a cladding layer is deposited on said multiple quantum well structure, comprising the steps of:
  a) forming a disordered region in said cladding layer wherein said disordered region is spatially separated from said multiple quantum well structure;
  b) thermally annealing said semiconductor heterostructure so that the vacancies/defects in said disordered region are caused to diffuse through said quantum well structure and enhance intermixing of atoms at heterojunctions of said quantum well structure, thereby at least partially reordering the disordered region, wherein the multiple quantum well structure still exists after said annealing step and exhibits a changed bandgap characteristic;
  c) reforming a disordered region in said cladding layer wherein said disordered region is spatially separated from said multiple quantum well structure; and
  d) thermally annealing said semiconductor heterostructure so that the vacancies/defects in said disordered region are caused to diffuse through said quantum well structure and enhance intermixing of atoms at heterojunctions of said quantum well structure, thereby at least partially reordering the disordered region, wherein the multiple quantum well structure still exists after said annealing step and exhibits a changed bandgap characteristic.

5. The method of selectively tuning the bandedge of a semiconductor heterostructure as defined in claim 4, wherein the thermal annealing in step is performed for at least 15 seconds.

6. The method of selectively tuning the bandedge of a semiconductor heterostructure as defined in claim 1 further comprising the step of:
  before performing step (a) masking said heterostructure in accordance with a specified pattern so that unmasked portions correspond to designated substructures of said single quantum well structure where bandgap modification is desirable.

7. The method of selectively tuning the bandedge of a semiconductor heterostructure as defined in claim 6 wherein the step of forming a disordered region includes the step of implanting ions into each of said designated substructures to form said corresponding disordered regions.

8. The method of selectively tuning the bandedge of a semiconductor heterostructure as defined in claim 1 further comprising the step of:
  before performing step (c) masking said heterostructure in accordance with a specified pattern so that unmasked portions correspond to designated substructures of said single quantum well structure where bandgap modification is desirable.

9. The method of selectively tuning the bandedge of a semiconductor heterostructure as defined in claim 8 wherein the step of forming a disordered region includes the step of implanting ions into each of said designated substructures to form said corresponding disordered regions.

10. The method of selectively tuning the bandedge of a semiconductor heterostructure as defined in claim 4 further comprising the step of:
  before performing step (a) masking said heterostructure in accordance with a specified pattern so that unmasked portions correspond to designated substructures of said single quantum well structure where bandgap modification is desirable.

11. The method of selectively tuning the bandedge of a semiconductor heterostructure as defined in claim 10 wherein the step of forming a disordered region includes the step of implanting ions into each of said designated substructures to form said corresponding disordered regions.

12. The method of selectively tuning the bandedge of a semiconductor heterostructure as defined in claim 4 further comprising the step of:
  before performing step (c) masking said heterostructure in accordance with a specified pattern so that unmasked portions correspond to designated substructures of said single quantum well structure where bandgap modification is desirable.

13. The method of selectively tuning the bandedge of a semiconductor heterostructure as defined in claim 12 wherein the step of forming a disordered region includes the step of implanting ions into each of said designated substructures to form said corresponding disordered regions.

14. The method of selectively tuning the bandedge of a semiconductor heterostructure as defined in claim 1, wherein the thermal annealing in step is performed for at least 15 seconds.

15. The method of selectivley tuning the bandedge of a semiconductor heterostructure as defined in claim 1, where in step (c) followed by step (d) is performed a plurality of times.

16. The method of selectivley tuning the bandedge of a semiconductor heterostructure as defined in claim 4, where in step (c) followed by step (d) is performed a plurality of times.

* * * * *